United States Patent [19]

Dudek

[11] Patent Number: 5,523,800
[45] Date of Patent: Jun. 4, 1996

[54] PROGRAMMABLE ALPHA/NUMERIC CHANNEL ENTRY TRANSLATION FUNCTION FOR HAND HELD VIDEO REMOTE CONTROLS

[76] Inventor: Walter J. Dudek, 21485 Indian Creek Dr., Farmington Hills, Mich. 48335

[21] Appl. No.: 145,526

[22] Filed: Nov. 4, 1993

[51] Int. Cl.$^6$ ....................................................... H04N 5/44
[52] U.S. Cl. ................... 348/734; 455/186.2; 340/825.72
[58] Field of Search ......................... 348/734; 358/194.1; 455/151.2, 186.2, 352, 353; 341/176; 340/825.69, 825.72; 359/146; H04N 5/44

[56] References Cited

U.S. PATENT DOCUMENTS

| | | | |
|---|---|---|---|
| 3,976,995 | 8/1976 | Sebestyen | 340/825.44 |
| 4,313,213 | 1/1982 | Farina | 455/186.2 |
| 4,626,848 | 12/1985 | Ehlers . | |
| 4,751,578 | 6/1988 | Reiter . | |
| 4,885,579 | 12/1989 | Sandbank . | |
| 4,912,463 | 3/1990 | Li . | |
| 4,914,428 | 4/1990 | Kobayashi . | |
| 4,959,720 | 9/1990 | Duffield | 348/734 |
| 4,999,622 | 3/1991 | Amano . | |
| 5,045,947 | 9/1991 | Beery | 455/186.2 |
| 5,191,423 | 3/1993 | Yoshida | 348/734 |

FOREIGN PATENT DOCUMENTS

| | | |
|---|---|---|
| 2104277 | 9/1962 | United Kingdom . |
| 2126002 | 3/1984 | United Kingdom . |

*Primary Examiner*—James J. Groody
*Assistant Examiner*—Sherrie Hsia
*Attorney, Agent, or Firm*—Terry M. Gernstein

[57] ABSTRACT

A Global Selection Decoder (GSD) device provides for a versatile channel selection function for hand held video remote controls which allows user programming of entries with alphabetic, numeric and special character entry code combinations that represent cable, broadcast and satellite TV's network names, station call signs or user defined codes along with its assigned video device numeric channel number. After programming, the user needs only to enter the Alpha/Numeric Code for the desired channel selection. This code is subsquently translated to its previously programmed assigned numeric channel number which is then transmitted to the video device. GSD's function is intergrated with and completely downward compatible with the current state of art hand held video remote controls for cable TV units, cable compatible televisions, video cassette recorders or players as well as satellite TV receivers and other video devices with numeric channel tuner capability. GSD's compatibility allows normal numeric channel selection and high priority to all selected device functions such as mute, power on/off, volume or channel up/down, play, record, rewind, etc.

25 Claims, 15 Drawing Sheets

MEMORY, MEMORY READ & WRITE REGISTER BIT LAYOUT

| ALPHA/NUMERIC KKKK ENTRY CODES | | | | CCC CHANNEL DIGITS | | |
|---|---|---|---|---|---|---|
| Kk | Kh | Kt | Ku | Ch | Ct | Cu |
| 1 OF 4 | 2 OF 4 | 3 OF 4 | 4 OF 4 | 1 OF 3 | 2 OF 3 | 3 OF 3 |
| 0 | 1 OF 3 | 2 OF 3 | 3 OF 3 | 0 | 1 OF 2 | 2 OF 2 |
| 0 | 0 | 1 OF 2 | 2 OF 2 | - | 0 | 1 OF 1 |
| 0 | 0 | 0 | 1 OF 1 | - | - | - |
| THOUSANDS | HUNDREDS | TENS | UNITS | HUNDREDS | TENS | UNITS |
| 000000 | 000000 | 000000 | 000000 | 0000 | 0000 | 0000 |
| BITS 0-5 | BITS 6-11 | BITS 12-17 | BITS 18-23 | BITS 24-27 | BITS 28-31 | BITS 32-35 |
| SEE FIGURE 5 FOR CHARACTER KEY CODE VALUES. 2 HIGH BITS UNUSED FOR CCC DIGIT CODES. | | | | | | |
| FIRST "K" KEY CANNOT BE A NUMERIC [0-9] KEY. | | | | | | |

FIGURE 4

TABLE OF KEY CODE VALUES

| | | | |
|---|---|---|---|
| 0 = 000000 | A = 010000 | K = 100000 | U = 110000 |
| 1 = 000001 | B = 010001 | L = 100001 | V = 110001 |
| 2 = 000010 | C = 010010 | M = 100010 | W = 110010 |
| 3 = 000011 | D = 010011 | N = 100011 | X = 110011 |
| 4 = 000100 | E = 010100 | O = 100100 | Y = 110100 |
| 5 = 000101 | F = 010101 | P = 100101 | Z = 110101 |
| 6 = 000110 | G = 010110 | Q = 100110 | / = 110110 |
| 7 = 000111 | H = 010111 | R = 100111 | & = 110111 |
| 8 = 001000 | I = 011000 | S = 101000 | + = 111000 |
| 9 = 001001 | J = 011001 | T = 101001 | - = 111001 |

BITS UNUSED FOR CCC CHANNEL DIGITS [FIGURE 4].

PF1 [+] & PF2 [-] PROGRAMMING KEYS.

FIGURE 5

MEMORY ADDRESS REGISTER

| DEVICE | ENTRY MEMORY LOCATION ADDRESS | | |
|---|---|---|---|
| OPTIONAL MULTI-DEVICE MEMORY SELECT<br><br>8 4 2 1 | 2 1<br>0 0 5 2<br>4 2 1 5<br>8 4 2 6 | 1<br>2 6 3 1<br>8 4 2 6 | 8 4 2 1 |
| 0 0 0 0 | 0 0 0 0 | 0 0 0 0 | 0 0 0 0 |
| BITS 15 - 12 | BITS 11 - 8 | BITS 7 - 4 | BITS 3 - 0 |
| BITS 8 - 15 DEPEND ON DEVICE OPTIONS AND/OR OPTIONAL NUMBER OF ENTRIES | | 256 ENTRY OPTION USES BITS 0 - 7<br>128 ENTRY OPTION USES BITS 0 - 6 | |

FIGURE 6

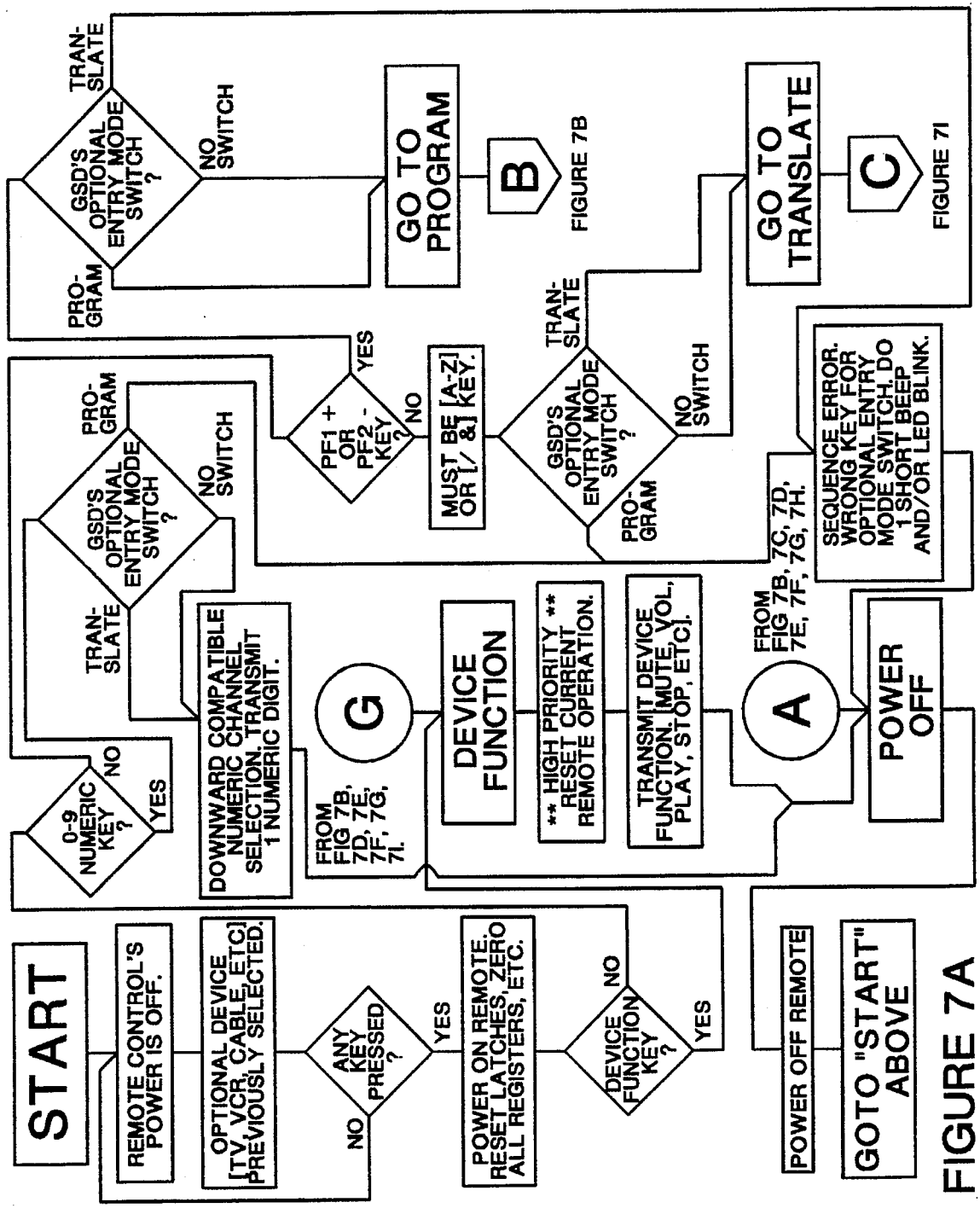

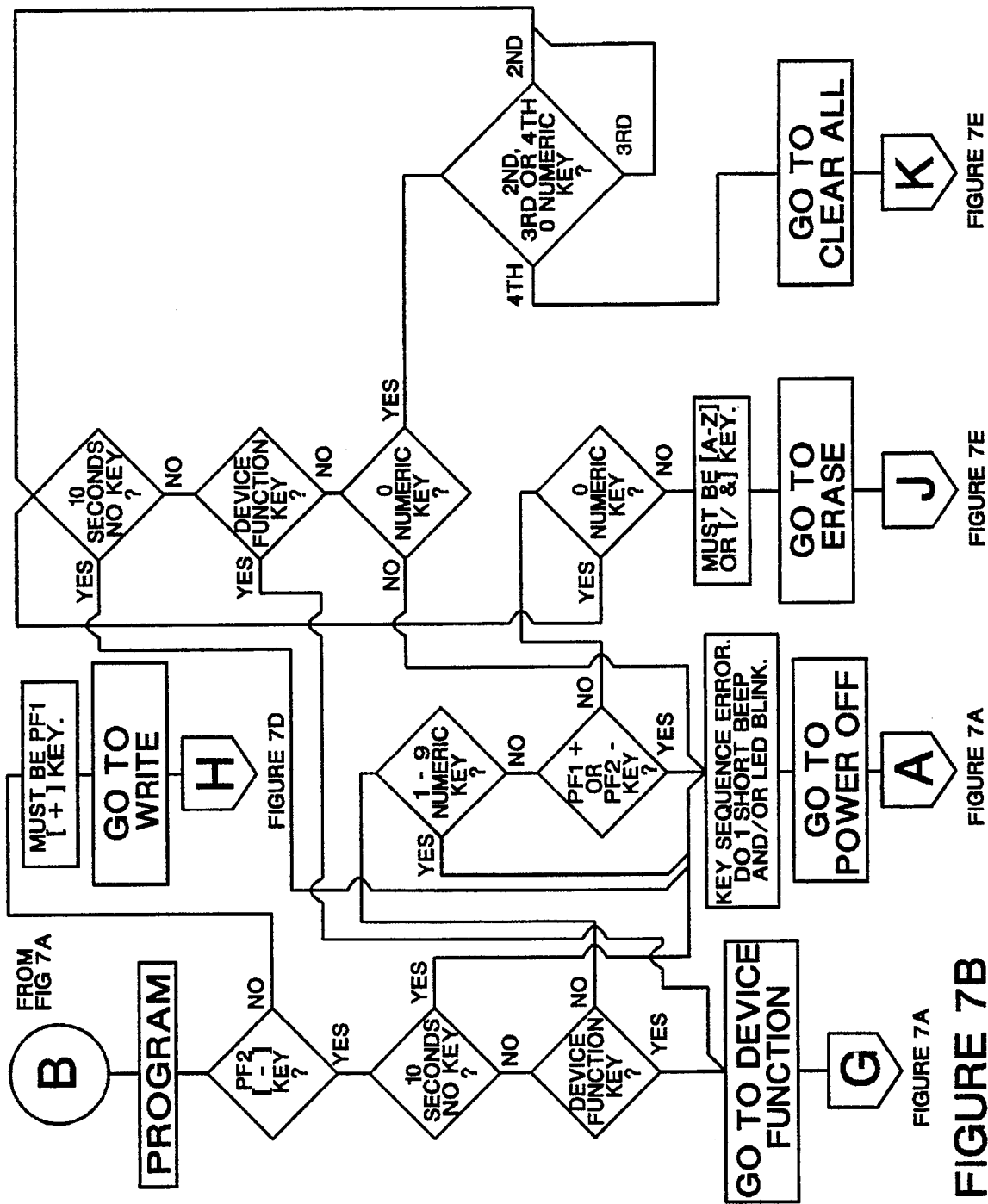

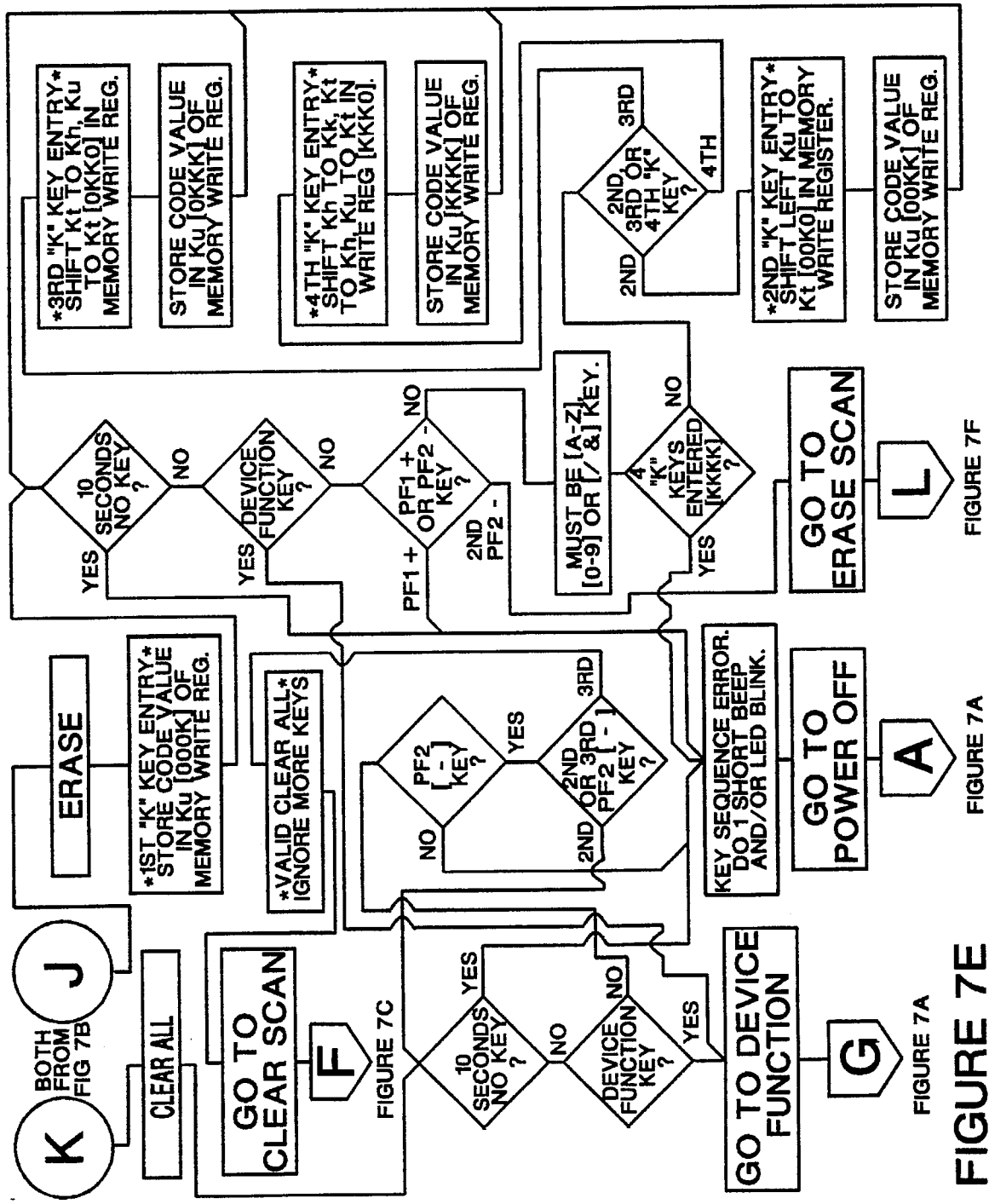

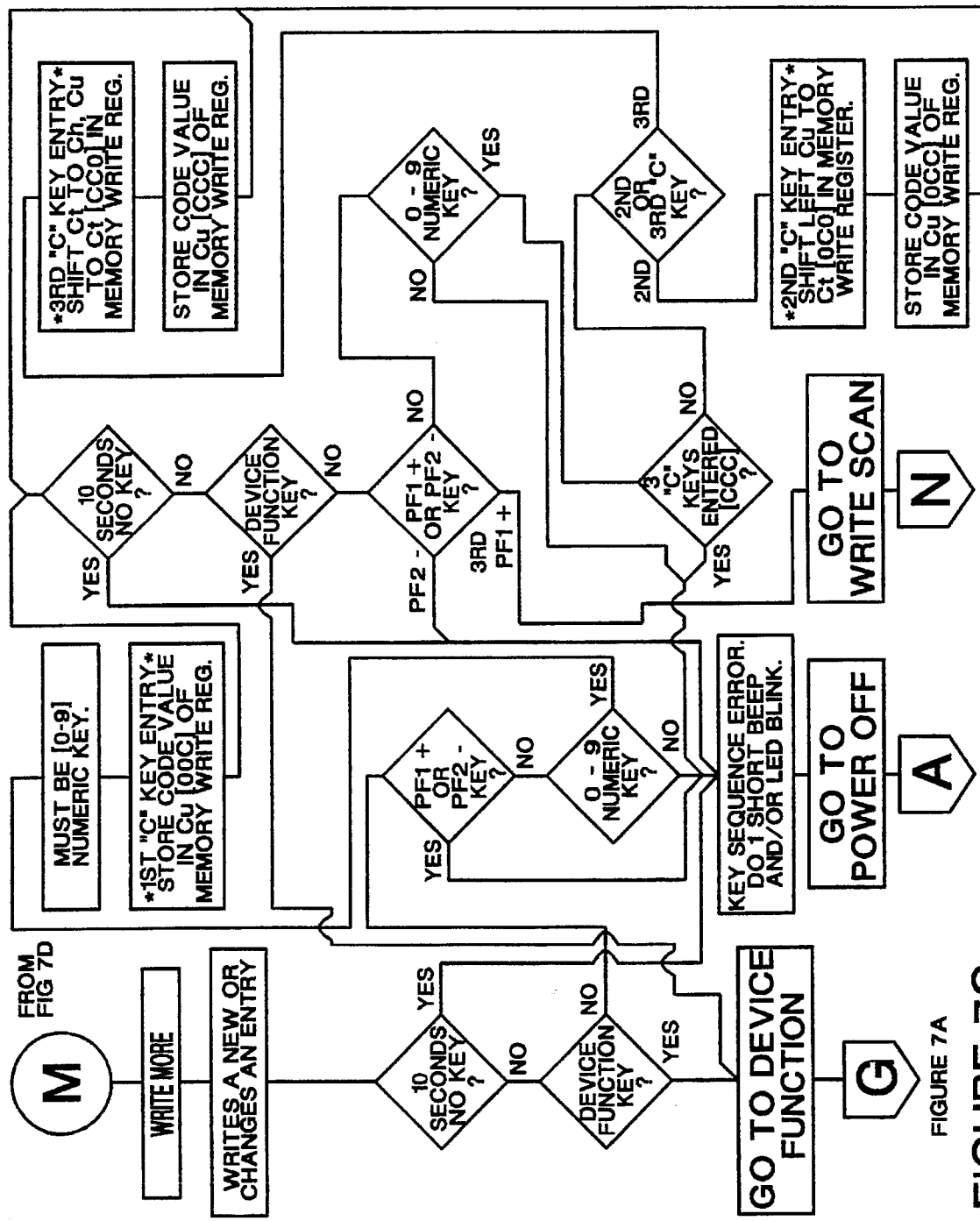

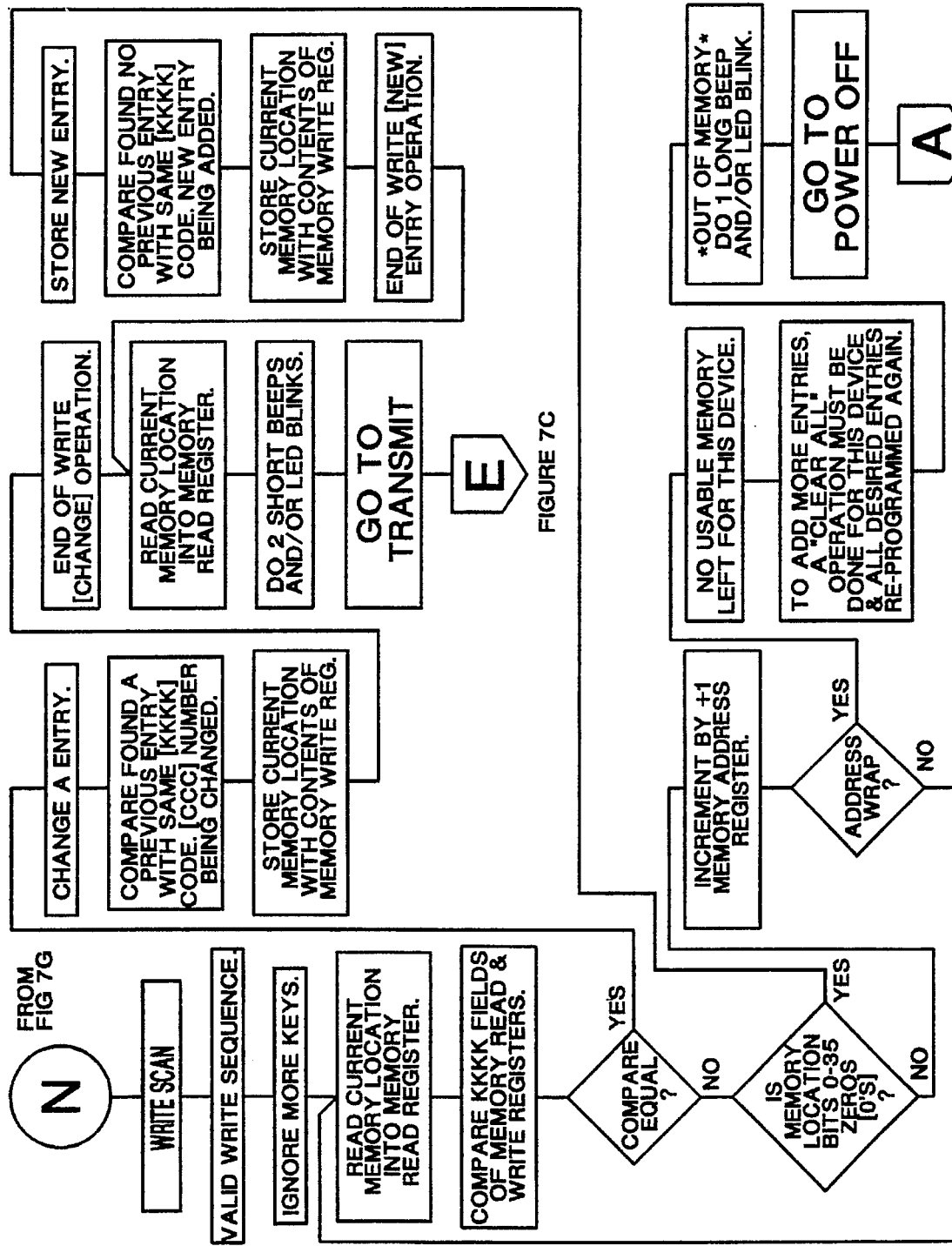

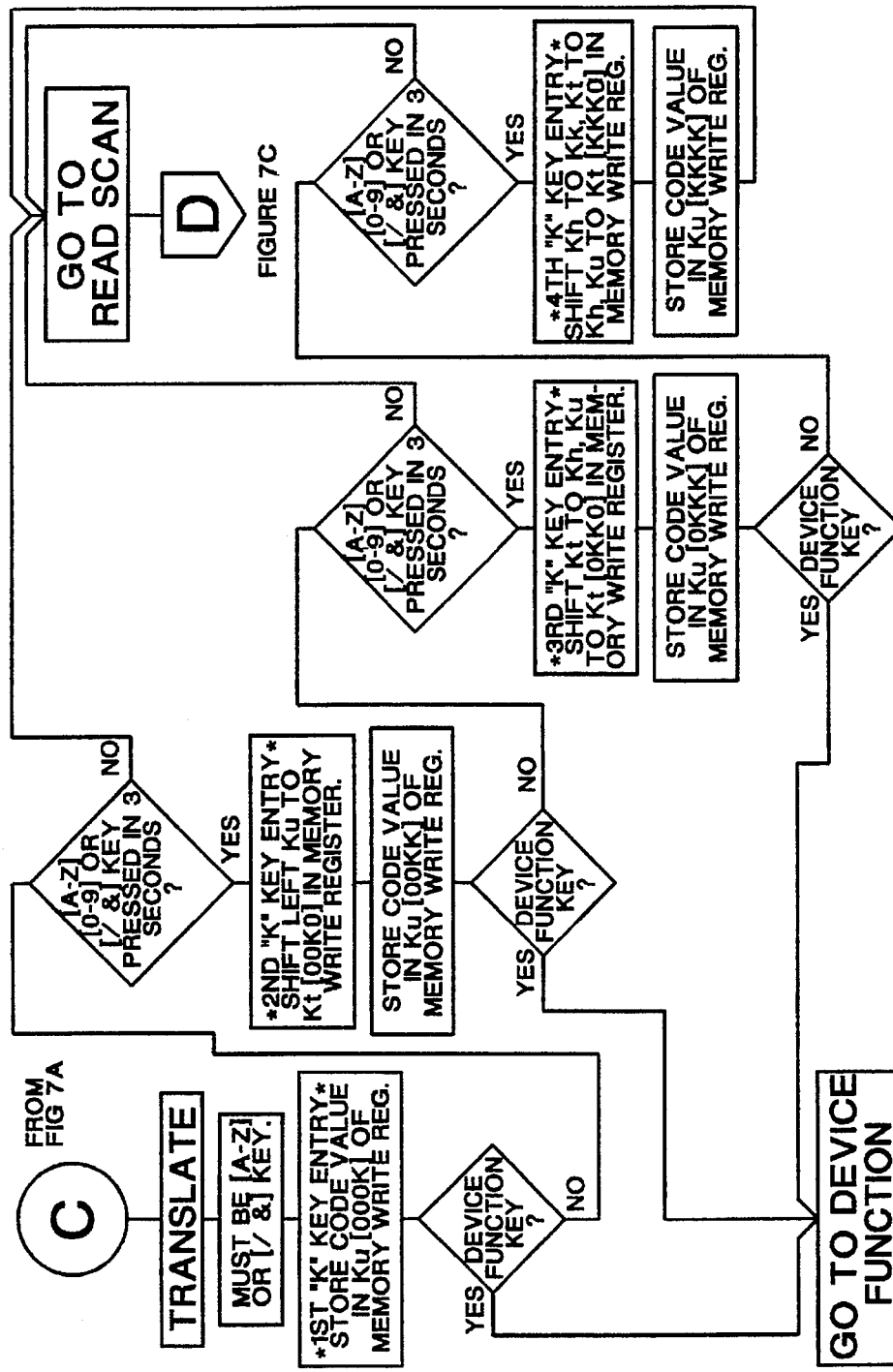

PROGRAMMABLE ALPHA/NUMERIC CHANNEL ENTRY TRANSLATION FUNCTION FOR HAND HELD VIDEO REMOTE CONTROLS

TECHNICAL FIELD OF THE INVENTION

The present invention relates to the general art of television accessories, and to the particular field of controls for television.

BACKGROUND OF THE INVENTION

Currently known video remote controls and video devices with channel tuner capability only allow numeric channel selection. As the amount of cable, broadcast and satellite TV networks continue to grow throughout the world, it is increasingly becoming more difficult for users to easily and quickly select their desired programming for viewing.

As channel numbers are device, geographic area, or cable company or satellite dependent, there is no consistant relationship between numeric channel numbers and the networks they represent. For the user to memorize the channel numbers and their association to the ever changing and increasing amount of network names and call signs, along with the increase in the amount of numeric channel selections becoming available for video devices further complicates the video programming selection process. The user spends a great deal of time consuming effort to select desired programming from the various TV guides, newspaper, cable or satellite listings. He or she then must cross reference the network to the video device's assigned numeric channel number so that channel selection can be made. Also if it desired to select various networks to see what is on, either memorization of assigned channels or cross referencing is necessary. As the viewing public becomes increasingly more dependent on network names and station call signs, the current system of numeric channel number selection by the user is fast becoming a less desirable channel selection method. This is especially so as so many people travel, and are not familiar with the numeric channel numbers associated with a particular network in a particular geographic area.

Therefore, there is a need for an alternate channel selection capability and methodology that is user friendly, simple to program and operate, versatile, optional, low cost, completely downward compatible and very easily intergrated with existing and future hand held video remote controls requiring no alterations to existing or future video devices. This new channel selection capability or function can be added to video remote controls whether they are manufactured for cable companies, the various video devices or as a universal video remote allowing everyone worldwide access to this much needed solution to the above-stated problem of selecting desired video programming.

OBJECTS OF THE INVENTION

It is a main object of the present invention to provide a GSD which is user friendly, simple to operate and program by a user.

It is another object of the present invention is to provide a GSD that is completely downward compatible with existing video remote operations allowing numeric channel selection and device functions.

It is another object of the present invention to provide a GSD in which the entire function is easily intergrated with current state of the art video remote technology using either microprocessor and/or hardware logic with non-volatile memory.

It is another object of the present invention to provide a GSD which is compatible with and requires no alterations to current and future video devices with numeric channel tuners and their associated bands (normal or HRC cable TV, broadcast TV VHF and UHF, satellite TV, etc).

It is another object of the present invention to provide a GSD in which the number of possible entry combinations provided with 1–4 keys (KKKK) using A–Z, 0–9 and 2 special characters (/ &) is 1,536,416 codes representing 1000 (CCC) possible asssigned numeric channel numbers (Note: 1st key non numeric, 28 possible charac- ters, A–Z and / &. 2nd thru 4th key has 38 possible characters, A–Z, 0–9, /&).

It is another object of the present invention to provide a GSD which facilitates optional memory areas for multi-device (2, 3, 4, etc in One) video remotes which are addressed by device selection (CABLE, TV, VCR, AUX, Etc).

It is another object of the present invention to provide a GSD which provides versatility allowing multiple code entries (KKKK) for same assigned device numeric channel numbers. Examples: ABC network and WXYZ call sign=07 for local broadcast TV channel. DIS and DISN=32 for the Disney Channel. NOST=30 for the Nostalgia Television Network broadcasted during the daytime and BRA, BRVO and BRAV=30 for the Bravo Network broadcasted during evenings on the same cable company assigned numeric channel. (Note: the DIS, DISN, BRA, BRVO and BRAV are shown as a example of various TV guides and schedules representing the Disney and Bravo networks differently but allowing user selection with either Alpha/Numeric code and of course, its numeric channel number.

It is another object of the present invention to provide a GSD which can be incorporated in optional low cost cable TV company remote's that are pre-programmed and leased or sold to the subscriber with/without "Program" entry mode, with either minumum memory size or Eprom or equivalent storage for Alpha/Numeric entries.

It is another object of the present invention to provide a GSD which can be intergrated with state of the art voice recognition technology that either supplements or replaces video remote's Alpha/Numeric keys, etc.

It is another object of the present invention to allow optional international character sets to replace an English character set.

It is another object of the present invention to provide a GSD which has optional enhancement of an LCD or equivalent display of (KKKK) and (CCC) entries during "Program" or "Translate" entry mode operations.

It is another object of the present invention to provide a GSD which further includes an optional single up/down entry stepping and transmit to device could be also done enabling user to review and record entries as well as do channel checks using GSD's Alpha/Numeric coded memory entries.

It is another object of the present invention to provide a GSD which is downward compatible numeric channel selection and device function selections are initiated on key depress, transmit to device is completed with video remote then powered off upon key release.

It is another object of the present invention to provide a GSD in which "Program" and "Translate" entry mode operations are executed upon key release.

It is another object of the present invention to provide a GSD in which video remote powers off after either a sequence error or 10 second timeout without another key press occuring in "Program" entry mode; or a successful or unsuccessful completion of "Program" or "Translate" operations.

BRIEF DESCRIPTION OF THE INVENTION

These, and other objects, are achieved by the Global Selection Decoder (GSD) of the present invention which completely provides a universal alternate channel selection capability. A user needs only enter a desired network call letters, such as NBC, CBS, ABC, ESPN, or the like, and the GSD translates this entry into the signals necessary to select that network. The GSD of the present invention can be programmed, and is totally compatible with existing remote controls whereby retrofit is easily achieved.

BRIEF DESCRIPTION OF THE DRAWING FIGURES

FIG. 4 is a GSD Memory, Memory Read And Write Register Bit Layout.

FIG. 5 is a Table Of Representative GSD Key Code Values.

FIG. 6 is a Representative GSD Memory Address Register.

DETAILED DESCRIPTION OF THE PREFERRED EMBODIMENT OF THE INVENTION

Figure 1:
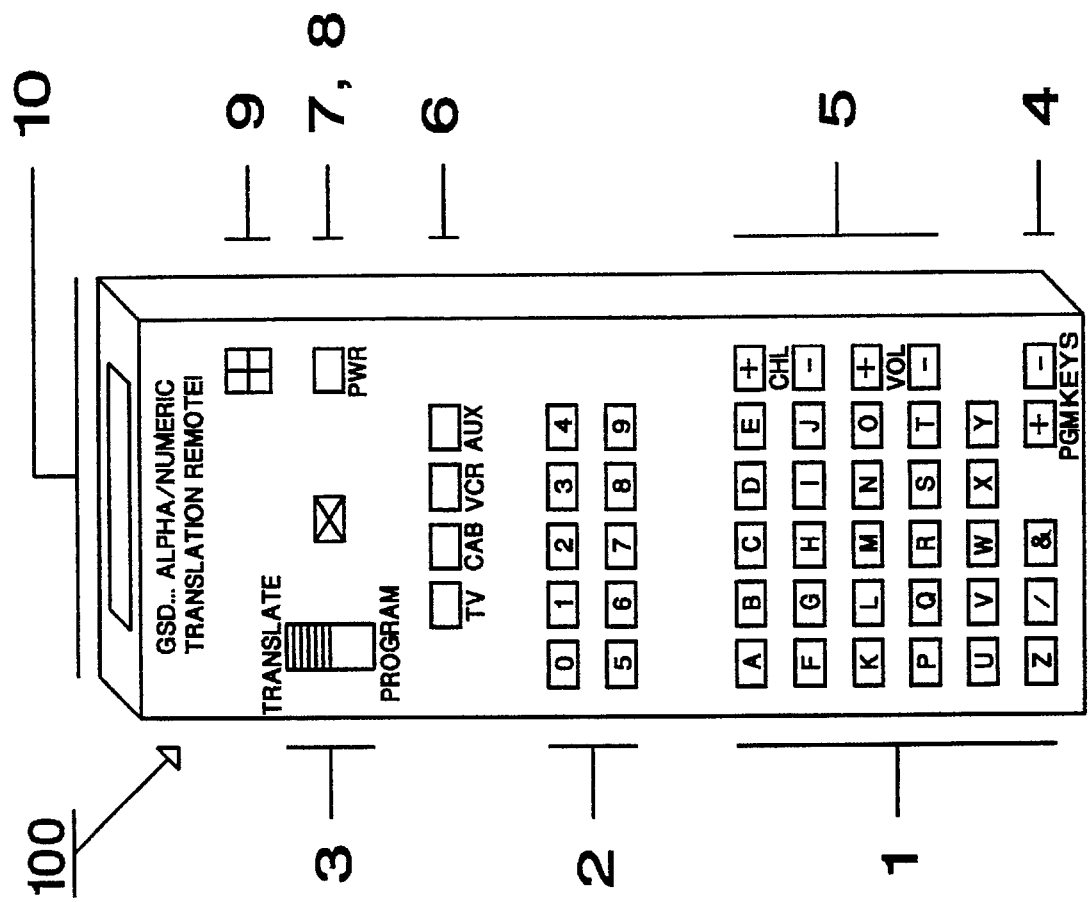
FIG. 1 is a Physical Representation, of the GSD Alpha/Numeric Video Remote embodying the present invention.

The GSD 100 of the present invention provides for a versatile new channel selection capability for hand held video remote controls that allows user programming of entries with 1,536,416 alphabetic, numeric and special character entry code combinations (KKKK, 1–4 characters) that represent cable, broadcast and satellite TV's network names, station call signs and unique user defined codes containing up to 1000 possible assigned video device numeric channel numbers (CCC, 1–3 digits) which are then translated and transmitted to the video device when the user selects desired video programming with one of these Alpha/Numeric coded entries. Optional size of entry memory locations (36 bits wide) is 256, 512, 1024, 2048, 4096, etc., which is dependent on the remote's application. Additionally, a multi-device remote (2, 3, 4, etc In One), memory size is replicated for each device.

The GSD function eliminates or minimizes the user's time consuming memorization and cross referencing of TV program listings to the video device's assigned numeric channel numbers that are dependent upon it's tuner band selection (Normal, HRC, VHF, UHF, etc) and the many differences in cable company, broadcast or satellite TV's geographic area channel number assignments.

The GSD function is intergrated and completely downward compatible with current existing state of art hand held video remote controls for cable TV units, cable compatible televisions and video cassette recorders or players, satellite TV receivers and other video devices with numeric channel tuner capability. Alterations to current or future video devices are not required to use this new function. Existing video devices can also utilize this new function with an optional cable company, original manufacturer's video device remote or universal video remote incorporating GSD 100. GSD 100 also includes means for automatic selection and transmission of at least 2 numeric channel digits maintains compatibility for various video devices. If (CCC) hundreds position is not zero (programmed for 3 digit device), then 3 numeric channel digits are transmitted. In addition, a leading zero (0) in (CCC) tens position is transmitted to maintain 2 digit compatibility.

The GSD's main differences from that of current video remote controls in external appearance is the addition of alphabetic and special character keys, 2 program function keys (+ −) and a switch to allow selection of "Program" and "Translate" entry modes of operation. The internal changes are the addition of electronic circuitry comprised of microprocessor and/or hardware logic along with non-volatile read/write memory that incorporates the new design function which then is intergrated with the required electronics for existing video remote control operation and features including the remote's power on/off circuits.

The current video remote features operate as before. All selected device functions (such as mute, power on/off, volume, channel up/down, play, record, rewind, stop, etc) have high priority over the GSD modes of operation. Also any numeric key pressed first will allow downward compatible normal numeric channel selection disabling translation mode.

The GSD function being readily programmable (storing new or changing existing entries, erasing/voiding of entries and clearing of all entries) allows easy user correction for changes in programming, video device, cable company or geographic areas differences worldwide. Hence the title: Global Selection Decoder (GSD).

OPERATION

Operationally, GSD 100 has 2 entry modes of operation. "Program" (Encode) and "Translate" (Decode). These modes are selected via a switch by the user. These are further broken down into several sub-operations. Prior to the first key press, the remote is powered off. When any key is pressed, the remote powers on and initiates a power on reset to all latches and zeroes (0's) all registers. The remote will remain on until the current operation is successfully completed or aborted due to a key sequence error or key time-out error. Changing the entry mode switch position will abort current operation and power off the remote. Additionally, the physical entry mode switch provides for a degree of protection from inadvertently changing of pre-programmed entries by requiring the user to deliberately select the "Program" entry mode of operation. Optionally, this switch may be removed to allow simpler user operation with possible less cost of manufacture. GSD 100 has the capability to recognize at first key press, 4 groups of keys and their operational differences: (1) Device function key initiating transmit of function to device and powering off remote; (2) Numeric key initiating transmit of digit to device for normal downward compatible numeric channel selection and powering off remote, to allow this, programming of (KKKK) entry codes will not let first key be a numeric; (3) Alphabetic or special character key initiating GSD's "Translate" entry mode operation and (4) Program Function keys Pf1 or Pf2 (+ −) initiating GSD's "Program" entry mode operations.

"Program" entry mode allows the user 2 options. The first option is initial selection of any device function (such as mute, power on/off, channel or volume up/down, play, stop, record, recall, etc) with transmit to device and video remote powering off upon key release. The second option is the actual programming of the GSD function. This second option is comprised of 4 different operations: (1) Storing a new entry; or (2) changing of an existing entry; (3) erase (void) of an existing entry; or (4) clearing of all entries assigned to the device being programmed. The "Program" operations are initiated by the first key press being either Program Function Key 1 (Pf1, +) or Program Function Key 2 (Pf2, −). Once started, any device function key pressed prior to the completion of the programming operation will abort the operation, transmit the device function and power off the remote. The programming operation must then be re-started. To abort any programming operation before completion, either change entry mode switch to "Translate" or quit pressing more keys. A 10 second timeout will abort the current operation and power off the remote. Additionally, "Program" operations are checked for the proper key sequences and will also abort operation and power off the remote. If a new entry or changed entry operation is successful, the entry's assigned 2 or 3 digit channel number is transmitted to the device as a check of programming the entry before powering off remote to await the user's next desired operation. During device function operations, device function code is transmitted to a device at key press and when transmit is completed, the remote then powers off upon key release to await next operation.

"Translate" entry mode allows the user 3 options. The first is selection and transmit of device functions to the device both as initial entry or during translate by aborting the operation and transmitting device function and powering off remote as cited in preceding description of device function in "Program" mode. The second option is numeric channel selection that is downward compatible to current existing video remote operation. If the first key pressed is numeric, then the remote operates to allow direct numeric channel selection to take place. The third option is translation of 1–4 Alpha/Numeric and special character key codes (KKKK) to the previously stored entry with its accompanying assigned device channel number (CCC). This is initiated by the first key pressed not being a device function or numeric key (0–9). When 3 seconds elapse after the 1st, 2nd or 3rd K key is released (or immediately after the 4th), the GSD function scans all memory entries for a match. If found, the entry's (CCC) is read and checked for non zero (0) value in the hundreds position. If non-zero, all 3 "C" digits are transmitted to device. If zero, the tens and units position are transmitted to device. Two digits are always transmitted to allow video device compatibility. This transmit simulates user numeric key presses and timing. After transmit is completed or no match is found, the remote is then powered off to await the user's next operation. During device function or numeric channel selection operations, device function code or numeric digit is transmitted at key press and when transmit is completed, the remote then powers off upon key release to await the next operation.

INSTRUCTIONS FOR USE AND OPERATION OF GSD 100

The Following Network Examples will be used For GSD

Programming and Translation Instructions:

| Broadcast Or Cable Network | TV Schedule Network Names | TV Station Call Sign | Optional User Code | Numeric Channel |
|---|---|---|---|---|
| Arts & Entertainment | A&E | | | 50 |
| American Broadcasting Company | ABC | WXYX | | 07 |
| Public Broadcasting System | PBS | | ED, EDUC | 08 |
| The Disney Channel | DIS, DISN | | | 32 |
| Home Box Office | HBO | | | 33 |
| Home Box Office 2 | HBO2 | | | 34 |
| The Nashville Network | TNN | | NN | 48 |
| Canadian Broadcasting Company | CBC | CBET | CAN | 09 |
| Video Hits 1 | VH1, VH-1 (VH/1) | | ROCK | 36 |
| Nostalgia Television Network | NOST | | OLD | 30 (Day) |
| Bravo Network | BRA, BRVO, BRAV | | | 30 (Nite) |
| Cable News Network | CNN | | NEWS | 40 |
| CNN Headline News | PART OF CNN | | HLN | 12 |
| American Christian Television System | ACTS | | WORD | 24 |
| Home Shopping Network | HSN, HSC | | SHOP | 28 |
| Nickelodeon | NIK, NICK | | | 41 |
| City Of Dearborn | | | DEA, CITY | 11 |
| Pay Per View 1 | PPV1, REQ1 | | | 37 |
| Pay Per View 2 | PPV2, REQ2 | | | 46 |
| TBS Superstation, Atlanta | TBS | WTBS | | 14 |
| Black Entertainment Television | BET | | SOUL | 57 |
| ESPN (Sports) | ESPN, ESN | | E | 26 |

"Program" operations are Comprised of the following:

+KKKK+CCC+ Stores new entries or changes memory entry with the same KKKK code.

−KKKK— Erases (voids) entry if matching entry with same KKKK code exists in Memory. Memory location is now unusable.

−0000— Clear (erases) all entries for video device, all entries must be re-programmed. Where KKKK is 1–4 Alpha/Numeric or special characters representing network names, station call signs or user assigned codes. It is noted that the first K must not be numeric. The CCC is 1–3 numeric digits that represent KKKK's assigned device channel numbers. Pf1 & Pf2 (+ −) are program function keys required for the different operations and are checked for correct sequences and valid key entries. If in error, the operation will be aborted and the remote will be powered off.

NOTES:

1. Leading zeros (0's) may or may not be entered for (CCC). Entering 7, 07 or 007 will result in 07 being transmitted to device.

2. Between the 1st and 3rd (last) + or − Key (Pf1 or Pf2), device function has high priority and will reset the programming operation, transmit function to video device and power off remote when key is released.

3. If a program operation is in progress and the next key isn't pressed within 10 seconds, the remote will power off thereby aborting operation.

4. Program operations are checked for the exact sequence of keys: Pf keys (+ −) out of sequence, missing or extra; too many K's or C's, a numeric key in first K, Alphabetic or special character key during (CCC), etc.

5. A successful store of new entry or change of entry matching KKKK will transmit (CCC) to video device allowing the user to check programmed entry.

6. If necessary to abort program operation, the user will select "Translate" Entry Mode, or wait for 10 seconds for key timeout or press a device function key.

7. Any key depressed: device function, alphabetic (A–Z), numeric key (0–9), special characters (/ &) and Pf1 or Pf2 (+ −) program function keys powers on the remote.

Programming the GSD video remote control.

1. If multi-device remote, the user selects device (CABLE, TV, VCR, AUX, Etc).

2. Next, select "Program" Entry Mode switch position.

3. For first time programming, device memory should be cleared. This operation clears all entries requiring reprogramming! Enter −0000— to clear device memory entries.

4. Using preceding network sample chart, the user will program new entries into the remote. Entries will include all network names, station call signs if any and optional user codes. To show various problems during "Program" operations, mistakes and other conditions will be included with corrections as necessary. Transmit of CCC numeric channel select digits to device will occur for successful new or changed entries and remote will power off after operations are completed. Sequence errors, 10 second no key timeouts will abort programming operation.

By way of example, to Program preceding network samples, enter as follows in exact sequence shown:

+A&E+50+ +ABC+7+ +WXYZ+7+ or +WXYZ+07+ or +WXYZ+007+ (Note: Zeros ok) +PBS+08+ +ED+8+ +EDUC− (Oops, abort) +EDUC+08+ +DIS+32+ +DISN+ 32+ +1 (Oops, abort) +HBO+33+ +HBO2+34+ (Oops, not available on cable, do a erase) −HBO2—- +TNN+48+ +NN+ 48+ +CBC+ "Mute Key" (Device sent a mute function, abort) +CBC+09+ +CBET+9+ +CA (Oops, the doorbell; 10 second timeout, abort) +CAN+9+ +VH1+36+ +VH/1+36+ (Note: / slash for - dash) +ROCK+36+ +NOST+30+ +OLD+ 30+ +BRA+30+ +BRVO+39+ (Oops, wrong, do change entry) +BRVO+30+ +BRAV+30+ C (Oops, abort) +CNN+ 40+ +NEWS+40+ +HLN+12+ +HSN+028+ (OK, sends a 28) +HSC+28+ +SHOPP (Oops, abort) +SHOP+28+ +NIK+ 41+ +NICK++ (Oops, abort) +NICK+41+ +DEA+11+ +CITY+111+ (Oops, not a 3 digit device, but this is how to enter 3 digits) +CITY+11+ +PPV1+37+ +REQ1+37+ +PPV24 (Oops, Abort) +PPV2+46+ +REQ2+46+ +TBS+ 14+ +WBTS+14+ (Oops, hope the user caught it. WTBS won't translate and will have to be entered later if this error is not detected. If detected, the user should erase and re-enter) −WBTS—- +WTBS+14+ (Note, if the user doesn't know the KKKK value entered in error, chances are he or she will never select it anyhow, so it can be omitted, the device has lots of memory) +BET+57+ +SOUL+57+ ESPN+26+ +ESN+26+ +E+26+ (Note, ESPN shown shortened to 1 character for easy entry. This is Ok, but may create duplicates overwriting desired entry codes).

To review: To change a entry with KKKK of AMC and CCC value of 12 to a CCC value of 47, enter +AMC+47+. To erase (void) a entry with KKKK of AMC, Enter −AMC− −.

"Translate" operation is comprised of the following:

KKKK Alpha/Numeric previously programmed code entered initiates GSD scan of device memory entries for a matching KKKK entry. If found, entry's CCC numeric channel value is transmitted to video device and remote powers off awaiting next operation. If not found, remote powers off. Where KKKK is 1–4 Alpha/Numeric or special characters representing network names, station call signs or user assigned codes. It is noted that the first K must not be numeric. CCC is 1–3 numeric digits that represent KKKK's assigned device channel numbers. For a match, entries must have been previously programmed.

NOTES:

1. Before last K Key, device function keys have high priority which resets translate, transmits function to video device and powers off remote when key is released.

2. If translate operation is in progress and 2nd, 3rd or 4th K Key (KKKK) isn't pressed in 3 seconds since last K Key released, GSD function will start a scan of entry memory for a matching KKKK entry. If the 4th K key is pressed and released, scan will start immediately. A successful match of KKKK entry will transmit its associated assigned channel number, 2 or 3 digits (CCC) to video device. The GSD's function is completely transparent to the video device.

4. If the first key pressed is a numeric key (0–9), the remote will reset translation operation and do normal downward compatible numeric channel number selection transmitting numeric (0–9) digit to device, then powering remote off upon key release.

5. If remote's first key press is a device function, the selected function is transmitted to the video device and remote powers off when the key is released.

6. In "Translate" Entry Mode, Pf1 & Pf2 (+ −) program function keys are ignored and will not power on remote.

7. If any other keys are depressed, device function, alphabetic (A–Z), numeric (0–9), special characters (/ &) will power on remote.

8. If entry (KKKK) is entered, but does not transmit (CCC) to video device, this entry should then be programmed as described in the preceding programming description. If entry (KKKK) selects wrong numeric channel (CCC), a change of entry should be done as shown in preceding programming description.

Translating with the GSD video remote control.

1. If multi-device remote, select device (CABLE, TV, VCR, AUX, Etc).

2. Select "Translate" Entry Mode switch position.

3. To select broadcast or cable networks as previously programmed, the user enters the network name, TV station call signs or user assigned code for GSD translation.

4. Downward compatible numeric channel selection is also available by entering assigned numeric channel numbers. User Indications or feedback in "Program" or "Translate" Entry Modes are comprised of visual (Leds) and audio (Beeps) to indicate correct or incorrect GSD remote control operation termination. A green LED indicates that the remote is powered on. If the LED is on steady, the battery is okay. If the LED is blinking, the battery is low. A red LED is included and indicates operation termination as in the examples presented below:

Examples of possible GSD's audio/visual indications:

"Translate" Entry Mode.
   No match=medium beep and red Led blink.
   Match, numeric select or device function=transmit of data to device.

"Program" Entry Mode.
   Key Sequence error or 10 second timeout=short beep & red Led blink.
   Erase with no match=medium beep & red Led blink.
   New entry memory unavailable=long beep and red Led blink.
   Erase completed=2 short beeps and red Led blinks.
   Clear all completed=2 short beeps and red Led blinks.
   Store new entry done=2 short beeps and red Led blinks with transmit to device.
   Change of entry done=2 short beeps and red Led blinks with transmit to device.

An optional GSD visual enhancement is an LCD or equivalent display of (KKKK) and (CCC) entries during "Program" or "Translate" entry mode operations. With this option, single up/down entry stepping and transmit to device could be also done enabling the user to review and record entries as well as do channel checks using GSD's memory entries. GSD "Program" and "Translate" entry mode operations are executed upon key release. The video remote powers off after either a sequence error or 10 second timeout without another key press occuring in "Program" entry mode; or a successful or unsuccessfule completion of "Program" or "Translate" operations.

FIG. 1: Physical Representation, GSD Alpha/Numeric Video Remote.

This figure shows a representative GSD hand held video remote control 100 with physical changes intergrated with a current state of the art generic multi-device universal video remote control. Various video remote control physical attributes shown are: (1) The addition for GSD function of 26 alphabetic keys A–Z, and 2 special character keys, / &, all indicated in section 1. It is noted that optional international character sets may replace the "English" character set shown. (2) Current existing 10 numeric keys, 0–9 that are intergrated with GSD function, all indicated in section 2. (3) Selection switch (recessed and/or "lockable") for GSD function "Program" and "Translate" Entry Modes, indicated in section 3. See option in operation section above regarding no entry mode switch. (4) GSD program function keys Pf1 and Pf2, + –, indicated in section 4. (5) Representative video device function keys such as mute, channel or volume up/down, play, record, rewind, stop, etc., indicated in section 5. (6) Optional multi-device remote control shown as a 4 In 1 remote, shown in section 6. (7) Represents remote LED's and/or LCD's displaying power on, battery condition, operational status of remote, optional display of remote's internal information, etc., indiated in section 7. (8) Video device's power on/off function key, indicated at 8. (9) Optional microphone for state of the art voice recognition technology that supplement or replace GSD key assignments, indicated at 9. (10) GSD function's required internal electronic circuitry comprised of either microprocessor and/or hardware logic with non-volatile memory intergrated with current state of the art hand held video remote internal electronic circuits, indicated at 10. It is noted that GSD 100 can also be manufactured using lower cost LSI or equivalent technology hardware logic instead of using a more costly microprocessor and hardware logic as determined during design of a proof-of-concept prototype using only hardware logic. Ultimately final selection of cost effective electronic packaging to be made by manufacturers.

Figure 2:
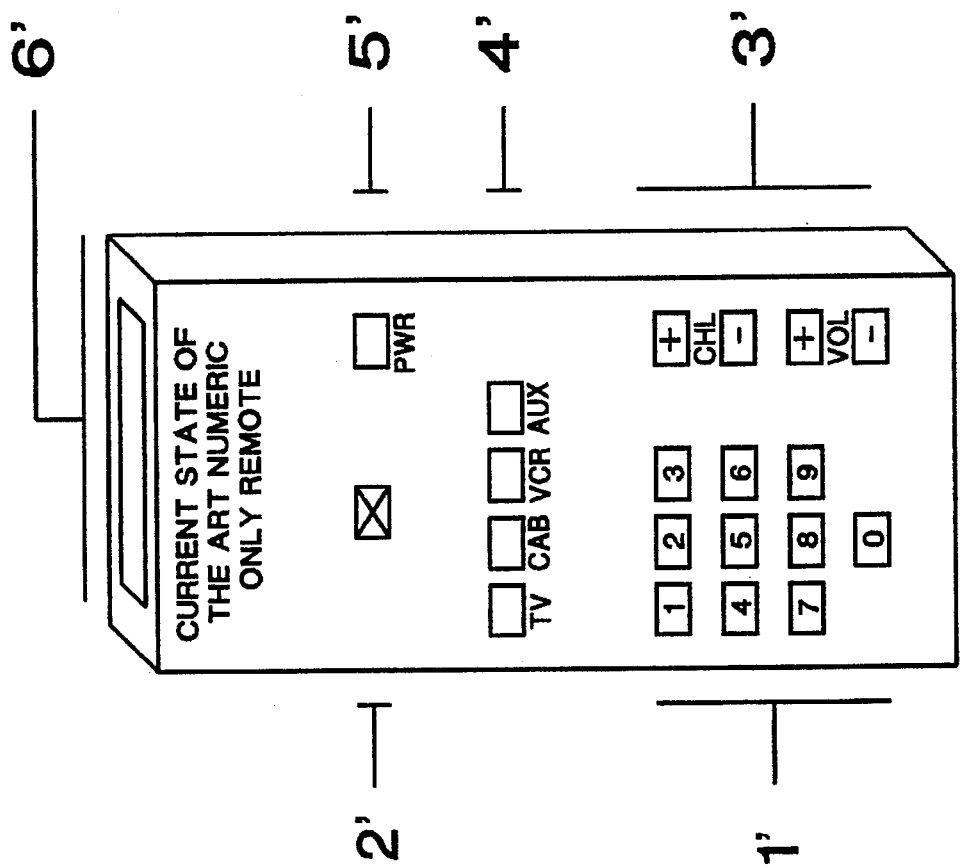
FIG. 2 is a Physical Representation Of Current Generic Video Remotes.

FIG. 2: Physical Representation Of Current Generic Video Remotes.

This figure is included to allow a comparision of the current existing state of the art video remote controls that only have numeric channel selection, see section 1', to FIG. 1 showing GSD 100 Alpha/Numeric function physical changes intergrated with current remote technology. Various video remote control physical attributes shown are: (1) 10 numeric keys 1', 0–9 that are used for device numeric channel selection. (2) Represents remote LED's displaying power on, battery condition, operational status of remote, etc., 2' (3) Representative video device function keys such as mute, channel or volume up/down, play, record, rewind, stop, etc., 3' (4) Optional multi-device remote control shown as a 4 In 1 remote, 4'. (5) Video device's power on/off function key, 5'. (6) Current state of the art hand held video remote internal electronic circuits, 6'.

Figure 3:
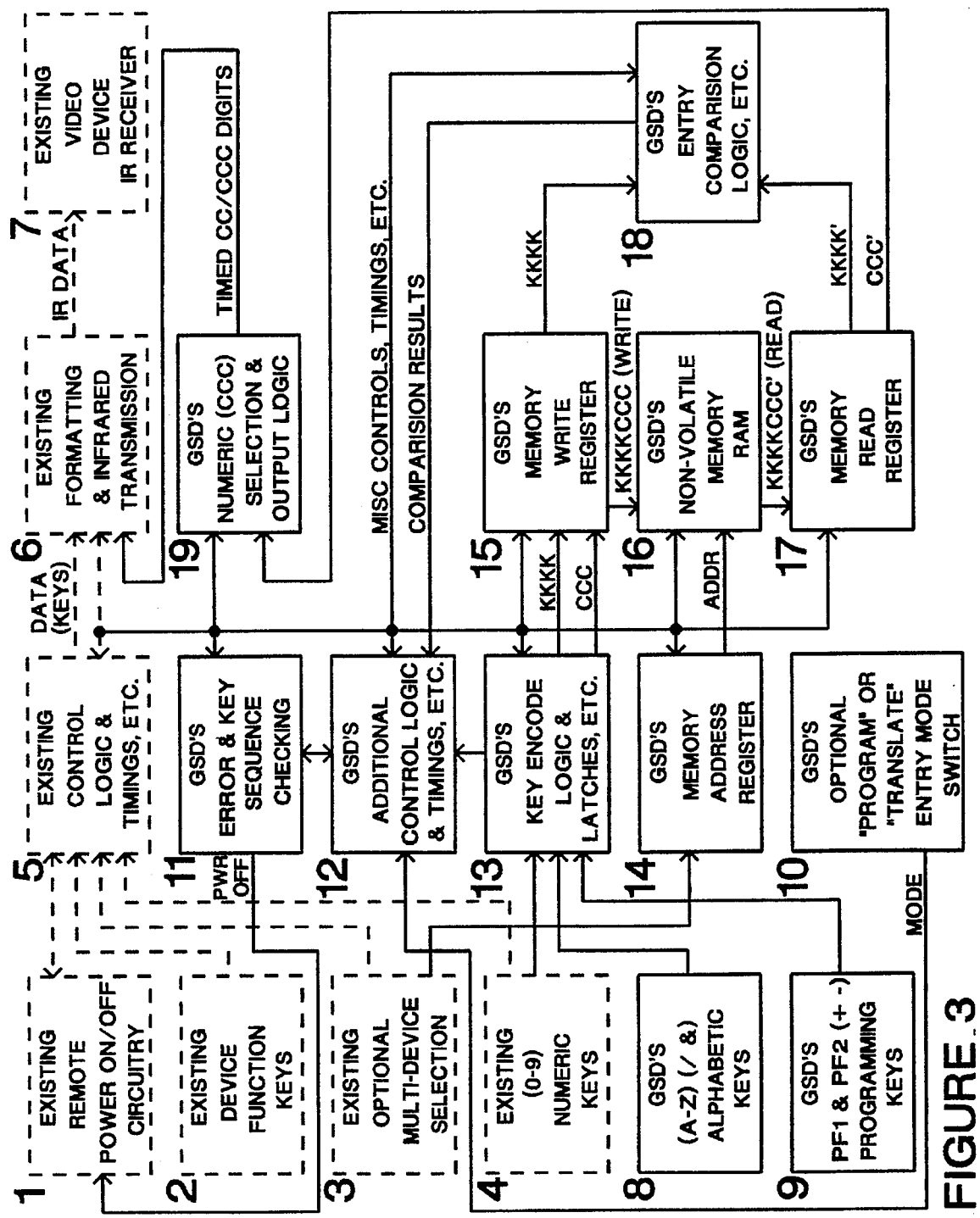
FIG. 3 is a Block Diagram, GSD Function And Current Remote Intergration.

FIG. 3: Block Diagram, GSD Function And Current Remote Intergration.

This figure shows all required GSD functional operations and logic that is detailed in the GSD 100 operational flowchart of FIG. 7, Sheets 1–8, with blocks representing either micro-processor operation and/or hardware logic with non-volatile memory, etc (shown in solid lines) all of which is intergrated with current state of art video remote control operation and functions (shown in dashed lines). The various functions and operational blocks of GSD 100 and intergration with current remote circuitry are described below. It should be understood that this is the best current representative design for GSD 100 showing its operational requirements that yet needs selection of an electronic platform of either microprocessor and/or hardware logic technology, other required components and packaging dependent upon the remote's application and selected options and enhancements along with the required intergration with current video remote technology, etc. Block (1) shows Remote power circuitry that contains the remote's power on/off controls, power on reset functions, batteries for remote's power and if required batteries for non-volatile memory of GSD 100. In addition, LED/LCD display drivers, audio device, etc., are contained in this block. GSD's new keys power on the remote. Error checking, key timeouts and operation completion., etc., power off the remote. Intergration to this block is extensive. Block (2) shows current remote's many optional device function keys such as mute, volume or channel up/down, device power on/off, rewind, play, record, stop, etc., intergrated with GSD's functions to allow high priority to selected device function keys. Block (3) shows current remote optional multi-device selection of 2, 3, 4, 8, etc in 1 remote control intergrated with GSD 100 by providing device memory areas and addressing for selected device entries independent of other device memory areas, hence GSD's versatility to many different video devices with their assigned numeric channel numbers. Block (4) shows numeric, 0–9 keys that operate in downward compatible mode for numeric channel selection as well as being intergrated with GSD function to allow for Alpha/Numeric coded entries and subsqent translation to device channel numbers. GSD "Program" and "Translate" entry mode operations are executed upon key release. Video remote powers off after either a sequence error or a 10 second timeout without another key press occurs in "Program" entry mode; or a successful or unsuccessful completion of "Program" or "Translate" operations, Block (5) represents all current video remote state of the art technology for control, operational logic and timings, etc., that is composed of micro-processor and/or hardware circuitry. The block is completely intergrated and co-dependent with the GSD's operations and hardware. Shown in block (6) is current remote control signal formatting and Infrared (IR) or equivalent transmission of functions and data to the controlled video device. Intergration of GSD function to this block allows transmitting previously programmed entries that are translated by simulating the user's numeric key presses and associated timings for device channel selection. Block (7) is representative of a video device and its receiver circuitry for remote control device function commands, numeric channel selection and other required data. Devices comprised of cable TV units, cable compatible televisions and video cassette recorders and players, satellite receivers and other video devices with channel tuner capability are compatible with this block. For GSD 100 operation, no alterations are required to the device. A compatible or universal video remote with GSD function will allow the device this alternate channel selection method which is completely transparent to video device. Block (8) shows GSD's added 26 alphabetic keys, A–Z and 2 special character keys, / &. Different or more special characters are optional as well as is international character sets. Block (9): there are 2 program function keys for the GSD function of "Program" Entry Mode operations, Pf1 and Pf2 + –. These keys allow for correct key sequences and error checking during programming operations. Pf keys are completely ignored when in "Translate" Entry Mode. Block (10): "Program" and "Translate" Entry Mode selection switch that controls the various GSD function operations. See option for no entry mode switch in operation section above. Block 11 contains all key sequence error checks and 10 second key timeout check in GSD "Program" Entry Mode function operations, which are intergrated with remote's power off circuits, etc. Block (12) represents all the electronic circuitry comprised of micro-processor and/or state of art hardware technology required by GSD 100 for its control logic, timings etc., and its intensive intergration with current remote hardware circuitry, etc. Block (13) shows GSD's key encoding functions "1 of 40 Coding" hardware logic, latches, or optional microcode, etc., See FIG. 5 for representative GSD key code values. Block (14) shows Memory Address Register for GSD's Alpha/Numeric entry memory, See FIG. 6 for register's details with optional addressing capability. Block (15) shows a Memory Write Register, Block (16) shows a Non-Volatile Memory for Alpha/Numeric entries and Block (17) shows a Memory Read Register that are shown in detail on FIG. 4 with operation described by GSD operational flowchart, FIG. 7, Sheets 1–8. Block (18) is KKKK Entry and KKKK Memory comparision hardware logic or microcode used during scan of entry memory for GSD's "Program" and "Translate" operations. See flowchart, FIG. 7 for comparision details. Block (19) shows CCC controls, timings and selection of 2 or 3 numeric digits simulating user key presses and timing during transmission to video device.

FIG. 4: GSD 100 Memory, Memory Read And Write Register Bit Layout.

This figure shows bit layout (36 bits) for KKKK and CCC Alpha/Numeric entries. The Write and Read Registers allow comparision of keyed KKKK entries to memory contents for either new or change of entry, erase (void) of entry in "Program" mode and comparison of entries for translation and transmit to video device in "Translate" mode. If erasing (voiding) an entry location, the Write Register is set to all ones (1's) and written to desired entry memory location to prevent subsequent equal (matching) comparisions during memory Write, Read or Erase scans as shown in GSD flowchart, FIG. 7, Sheets 1–8. Additionally, the Write Register is set to all Zeros (0's) during Clear Scan and is written into all memory entry locations. During subsequent new entry programming, the first all zeros (0's)location found while sequentially write scanning memory is then written with the Write Register's contents if a KKKK match hasn't occured first which would have stopped write scan and writes the Write Register to matching entry as a changed entry. Memory Write Register is also used as a temporary buffer to hold and shift left keys as entered for the KKKK and CCC characters used for the required memory operations for GSD's "Program" and "Translate" functions. During memory Write, Read and Erase Scans the current addressed entry location is read into the Read Register to allow the necessary operation comparision and use of the CCC data translated to transmit the numeric channel number to the video device. It is noted that during a Write scan, if no unused memory locations are found with all zeros (0's), the user is notified that memory must be cleared by "Clear All" before preceding with programming new entries.

FIG. 5: Table Of Representative GSD Key Code Values.

This figure shows GSD's (1 Of 40 Coded) Alphabetic (A–Z), Numeric (0–9), Special Characters (/ &) and Program Function Keys, Pf1 and Pf2 (+ –) key code values. This key code value scheme is selected for GSD 100 for the following reasons: it allows for easy matrixing of the keyboard, 6 bits per character minimizes the amount of bits required for Entry Memory, Memory Read and Write Registers to 36 bits. It also allows only 4 BCD bits to represent each CCC numeric digit while eliminating any need for binary to BCD conversions, etc. Optionally, if two more special characters are desired, the Pf1 and Pf2 keys could be assigned values similar to the device function keys and the key code values of 111000 and 111001 be used for the additional special characters. These selected key code values also reduce comparision time, logic circuitry required, etc.

FIG. 6: Representative GSD 100 Memory Address Register.

This figure shows GSD's Entry Memory Address Register operating in standard binary logic. Each address accesses an entry location that is 36 bits wide containing entry's KKKK and CCC key code values (See FIGS. 4 and 5). Because only sequential memory scan is done during GSD operations, there is no requirement for random access of memory. Scanning memory by +1 address increments lends itself well to the necessary operation comparisions as well as facilitating quick Clear All memory scans. Scanning is required to ensure all locations are checked during the various GSD operations. Due to the relative small number of memory locations, time or speed of scanning is not a factor. Also the remote's power on reset when any key is first pressed, insures the Memory Address Register is at the "Bottom" ready to start the various operational upward scans. See GSD Flowchart, FIG. 7, Sheets 1–8 for more detail. Additionally as shown, this design allows easy changes for larger memory options as well as providing unique addressed memory "banks" for each optional device if a multi-device video remote. Optionally, +1 or −1 incrementing would allow for single up or down stepping of memory locations with or without an optional LCD display of memory entries.

FIG. 7: Representative GSD 100 Operational Flowchart (8 Sheets).

This figure (8 sheets) shows a representative best design of detailed operational flow diagram for the GSD function and its operations along with the essential intergration necessary to current state of the art video remote controls to allow downward compatible numeric channel selection and priority to device function key operations. This flowchart, along with the other figures and descriptions included in this disclosure, can be easily adapted to either a micro-processor and its programming language and/or required hardware logic for actual product implementation of the GSD Function design parameters. As this flowchart is a very highly detailed and inclusive replication of GSD's design, its easily understood flow when coupled with the other figures and descriptions does not need a detailed explanation as such. Instead, a basic description of a routine's operational purpose will follow with the routine title, sheet number and sheet entry letter if any.

START-SHEET 1 begins with the remote being powered on by any key press, and if "Translate" Entry Mode was selected, will do a power on reset to its hardware electronics. It then determines if a numeric key hs been pressed for downward compatible numeric channel selection or a device function key pressed, both of which will reset "Translate" and transmit a numeric channel digit or device function to the selected video device and then power off remote upon key's release to await next key press. Basically the same thing occurs if in "Program" Entry Mode, however only device function is allowed, not numeric channel selection.

POWER OFF-SHEET 1,A is as it indicates. Next key press goes to START.

TRANSLATE-SHEET 1 & TRANSLATE MORE-SHEET 3,D stores entry keys KKKK in Memory Write Register until 3 seconds elapse after 1st, 2nd or 3rd key is released or immediately after 4th key is released going to READ SCAN. It is noted that device functions have high priority before READ SCAN and resets translation operation and will transmit function to device and power off remote upon key release.

READ SCAN-SHEET 3,C allows scanning and comparision of memory entries for a match of KKKK's. Match goes to TRANSMIT, none powers off remote.

TRANSMIT-SHEET 3,E using CCC from Memory Read Register, determines if 3 digits should be sent to device if Ch position is non-zero, otherwise it defaults to sending always 2 digits to device. These numeric channel selection digits are formatted and then transmitted to video device by simulating user key presses and approximate timimg between keys.

PROGRAM-SHEET 2,B checks Program Function keys, Pf1 & Pf2 (+ −) to determine if operation is WRITE, ERASE or CLEAR ALL. It is noted that any device function keys pressed before a WRITE SCAN, ERASE SCAN or CLEAR SCAN has high priority over GSD programming by going to DEVICE FUNCTION routine.

DEVICE FUNCTION-SHEET 2,G resets programming operation in progress and will transmit selected function to device and power off remote.

WRITE-SHEET 4,H enters 1–4 KKKK key code values into the Memory Write Register while checking for key sequence and 10 second no key press timeout errors. After KKKK's are keyed in, goes to WRITE MORE for the CCC entry.

WRITE MORE-SHEET 7,M enters 1–3 CCC numeric key code values into the Memory Write Register while checking for key sequence and 10 second no key press timeout errors. After CCC's are keyed in goes to WRITE SCAN.

WRITE SCAN-SHEET 8,N scans device entry memory while comparing Memory Write and Read Registers for either a matching KKKK entry code in which case would be a changing of the CCC for a previously programmed entry allowing Memory Write Register to be written to current addressed memory location; or for all zeros (0's) in the Memory Read Register indicating an unused memory location and writing the contents of Memory Write Register to memory as a new entry. Successful completion of these two operations will allow the user to check programming by going to TRANSMIT routine. If the device is out of usable memory for a new entry, the user is notified and the remote powers off.

CLEAR ALL-SHEET 5,K completes PROGRAM routine's check for proper key sequence for memory clear all operation. If valid, the device goes to CLEAR SCAN.

CLEAR SCAN-SHEET 3,F sets Memory Write Register to all zeros (0's) and writes register's contents to each memory location while scanning all of memory. When complete, the device indicates to the user and powers off the remote.

ERASE-SHEET 5,J enters 1–4 KKKK key code values into the Memory Write Register while checking for key sequence and 10 second no key press timeout errors. After KKKK's keyed in the device goes to ERASE SCAN to find entry.

ERASE SCAN-SHEET 6,L scans device entry memory while comparing Memory Write and Read Registers for a matching KKKK entry code. If found, the Memory Write Register will be set to all one's (1's) and written to current memory location thus voiding the location so it will no longer compare as a matching entry or compare to all zeros (0's) as a unused memory location. When complete, the device indicates to the user and powers off remote.

It is understood that while certain forms of the present invention have been illustrated and described herein, it is not to be limited to the specific forms or arrangements of parts described and shown.

I claim:

1. A Global Selection Device (GSD) comprising:

A) a hand held video device for remotely controlling a video device, said hand held video device having Alpha/Numeric keys thereon which are pressed by a user when using said hand held video device;

B) programmable means on said hand held video device for assigning pre-selected channel number signals to selected keys that in combination represent cable, broadcast and satellite TV's network names, station call signs and user-defined code entries; and C) transmitter means on said hand held video device for transmitting signals from said hand held video device to the video device when the Alpha/Numeric keys are pressed and transmitting said pre-selected channel number signals to the video device as codes normally received by the video device when said selected keys are pressed whereby the user selects a desired channel by pressing the Alpha/Numeric keys for that desired channel and translation into signals commonly received by the video device having appropriate codes for the desired channel is performed in said hand held video device prior to transmitting the signals to the video device.

2. A Global Selection Device (GSD) consisting entirely of:

A) a hand held video device for remotely controlling a video device, said hand held video device having Alpha/Numeric keys thereon which are pressed by a user when using said hand held video device;

B) programmable means on said hand held video device for assigning pre-selected channel number signals to selected keys that in combination represent cable, broadcast and satellite TV's network names, station call signs and user-defined code entries; and C) transmitter means on said hand held video device for transmitting signals from said hand held video device to the video device when the Alpha/Numeric keys are pressed and transmitting said pre-selected channel number signals to the video device as codes normally received by the video device when said selected keys are pressed whereby the user selects a desired channel by pressing the Alpha/Numeric keys for that desired channel and translation into signals commonly received by the video device having appropriate codes for the desired channel is performed in said hand held video device prior to transmitting the signals to the video device.

3. A Global Selection Device (GSD) for use in a hand held video device for remotely controlling a video device, with the hand held video device having Alpha/Numeric keys thereon which are pressed by a user when using the hand held video device comprising:

A) programmable means on the hand held video device for assigning pre-selected channel number signals to selected keys that in combination represent cable, broadcast and satellite TV's network names, station call signs and user-defined code entries; and B) transmitter means on the hand held video device for transmitting signals from the hand held video device to the video device when the Alpha/Numeric keys are pressed and transmitting said pre-selected channel number signals to the video device as codes normally received by the video device when said selected keys are pressed whereby the user selects a desired channel by pressing the Alpha/Numeric keys for that desired channel and translation into signals commonly received by the video device having appropriate codes for the desired channel is performed in the hand held video device prior to transmitting the signals to the video device.

4. The GSD defined in claim 1 wherein the Alpha/Numeric keys include 26 alphabetic keys.

5. The GSD defined in claim 4 wherein the Alpha/Numeric keys include a "/" key and a "&" key.

6. The GSD defined in claim 5 further including entry means for 2 selectable entry modes of operation including "Program" and "Translate" and further including an external physical switch on said hand held video device.

7. The GSD defined in claim 1 further including means on said hand held video device for automatically selecting four options.

8. The GSD defined in claim 1 further including 2 Program Function Keys on said held video device.

9. The GSD defined in claim 1 further including means on said hand held video device for providing high priority to function keys by reset of GSD "Program or Translate" operation in progress and transmitting selected device function.

10. The GSD defined in claim 1 further including means on said hand held video device for automatic selection and transmit of at least 2 numeric channel digits.

11. The GSD defined in claim 1 further including means on said hand held video device for transmitting translated 2 numeric digits (CCC) to simulate a user's key presses and timing.

12. The GSD defined in claim 1 further including means on said hand held video device for translating and transmitting of a matched Alpha/Numeric entry to the video device within 3 seconds after last key for K, KK, KKK combinations is released and immediately after the last key is released for a KKKK combination in a "Translate" mode.

13. The GSD defined in claim 1 further including said programming means on said hand held video device for effecting downward numeric channel selection to occur if a numeric key is pressed first when in a "Translate" entry mode.

14. The GSD defined in claim 13 wherein said "Translate" entry mode allows the user 3 options which include a normal numeric channel selection, a selection of all device functions, and selection of previously programmed Alpha/Numeric codes which in combination represent the cable, broadcast and satellite TV's network names, stations call signs and user-defined codes which are then translated and numeric channel assignments associated with the Alpha/Numeric codes are transmitted to the video device.

15. The GSD defined in claim 14 including means on said hand held video device for defining a "Program" entry mode wherein said "Program" entry mode allows the user 2 options including selection of all device functions, and GSD programming comprised of 4 options including (1) Store new entry, (2) Change existing entry, (3) Erase existing entry and (4) Clear all device memory entries.

16. The GSD defined in claim 12 further including a first program operation means in which a first key sequence of +KKKK+CCC+ stores new entries.

17. The GSD defined in claim 16 further including a second program operation means which has said first key sequence of +KKKK+CCC+ and which changes an existing entry with same KKKK code combination to a desired assigned numeric channel.

18. The GSD defined in claim 17 further including a third program operation means which has key sequence of –KKKK–– and which erases an entry if a matching entry with same KKKK code combination exists.

19. The GSD defined in claim 18 further including a fourth program operation means which has a key sequence of –0000–– and which clears all entries for video device memory being programmed.

20. The GSD defined in claim 19 further including means for transmitting numeric channel numbers to the video device after successfully storing or changing an entry in a "Program" mode.

21. The GSD defined in claim 20 further including means for aborting programming operation and power off remote during the "Program" mode operation key sequence errors and ten second key timeouts.

22. The GSD defined in claim 21 further including means for preventing duplication of entries, which includes means for changing an entry to a new (CCC) value if duplication of Entry's (KKKK) code matches during program of a "new" entry.

23. The GSD defined in claim 21 further including a user feedback means in the "Program" mode comprised of visual and audio signals to indicate correct or incorrect GSD remote control operation termination, and on said hand held video device further including a Green LED for indicating remote power on and battery status, and a Red LED which blinks and a buzzer which beeps to indicate operation termination.

24. The GSD defined in claim 1 further including means on said hand held video device for sequentially scanning memory locations for all GSD operations upward from a "bottom".

25. The GSD defined in claim 24 further including means on said hand held video device for storing entries sequentially upward as new entries are programmed, and means for notifying the user when memory is full.

* * * * *

UNITED STATES PATENT AND TRADEMARK OFFICE
CERTIFICATE OF CORRECTION

PATENT NO. : 5,523,800  
DATED : June 4, 1996  
INVENTOR(S) : Walter J. Dudek

Figure 7C:
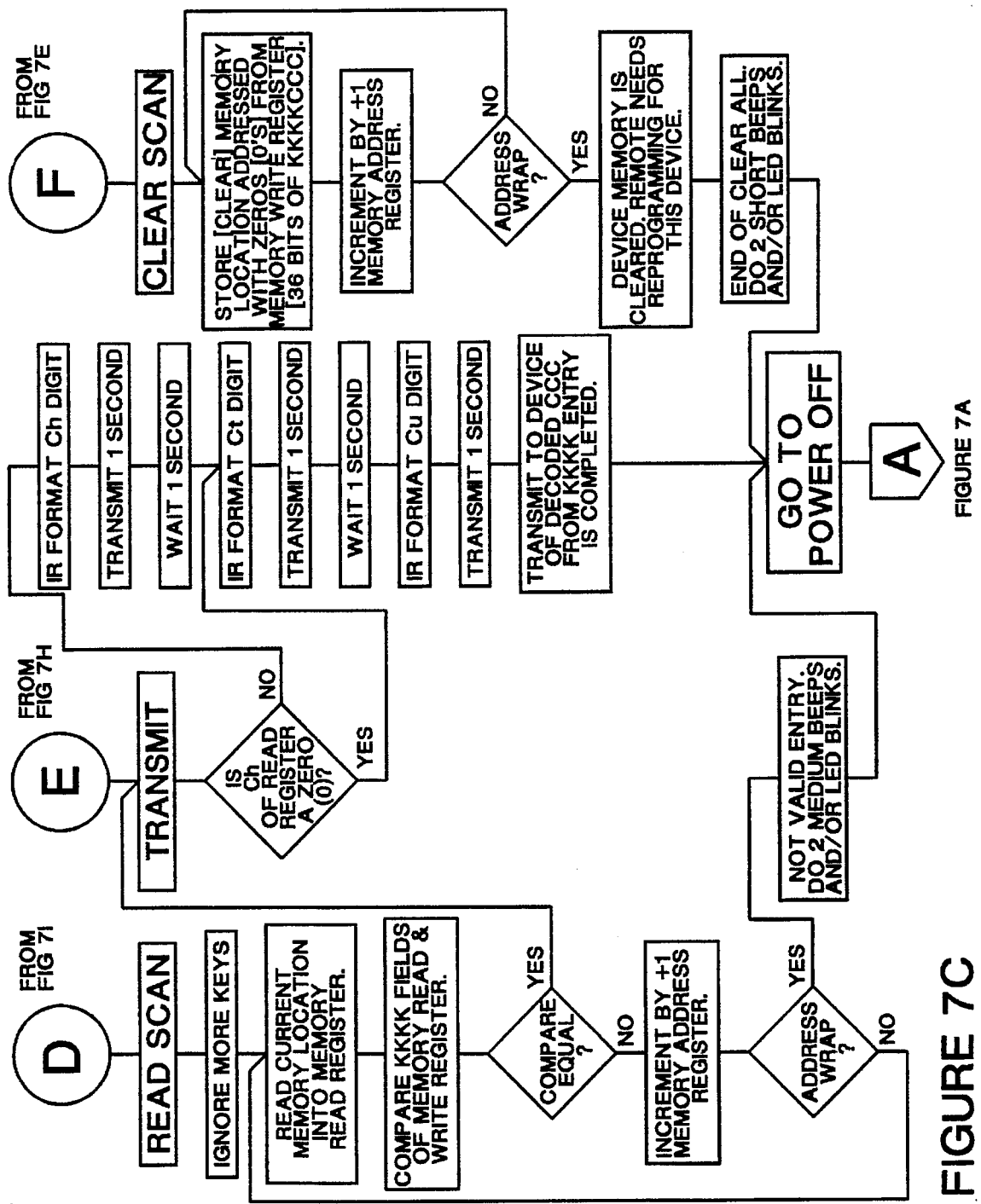
FIG. 7 is a Representative GSD Operational Flowchart.
Figure 7D:
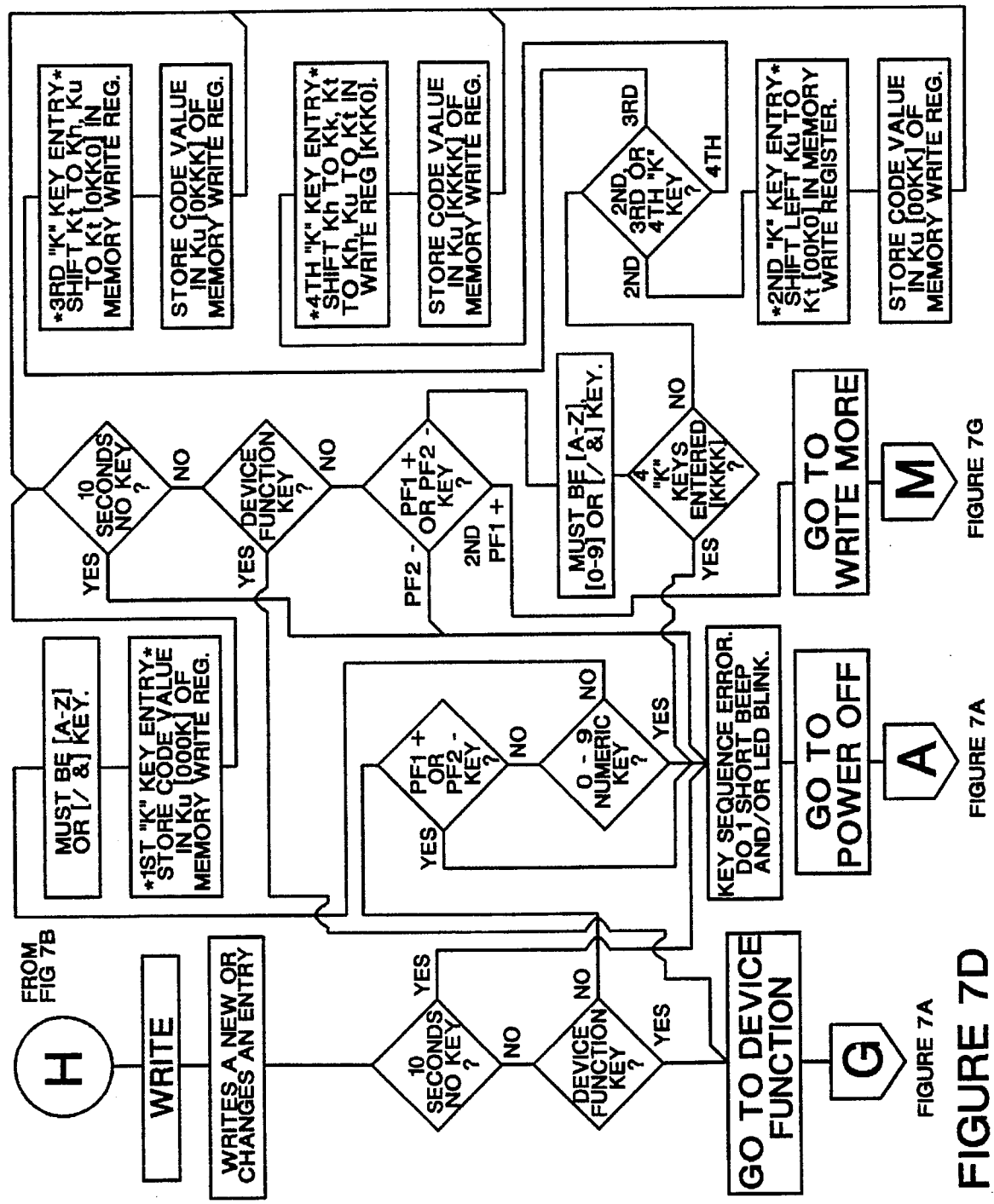
Figure 7F:
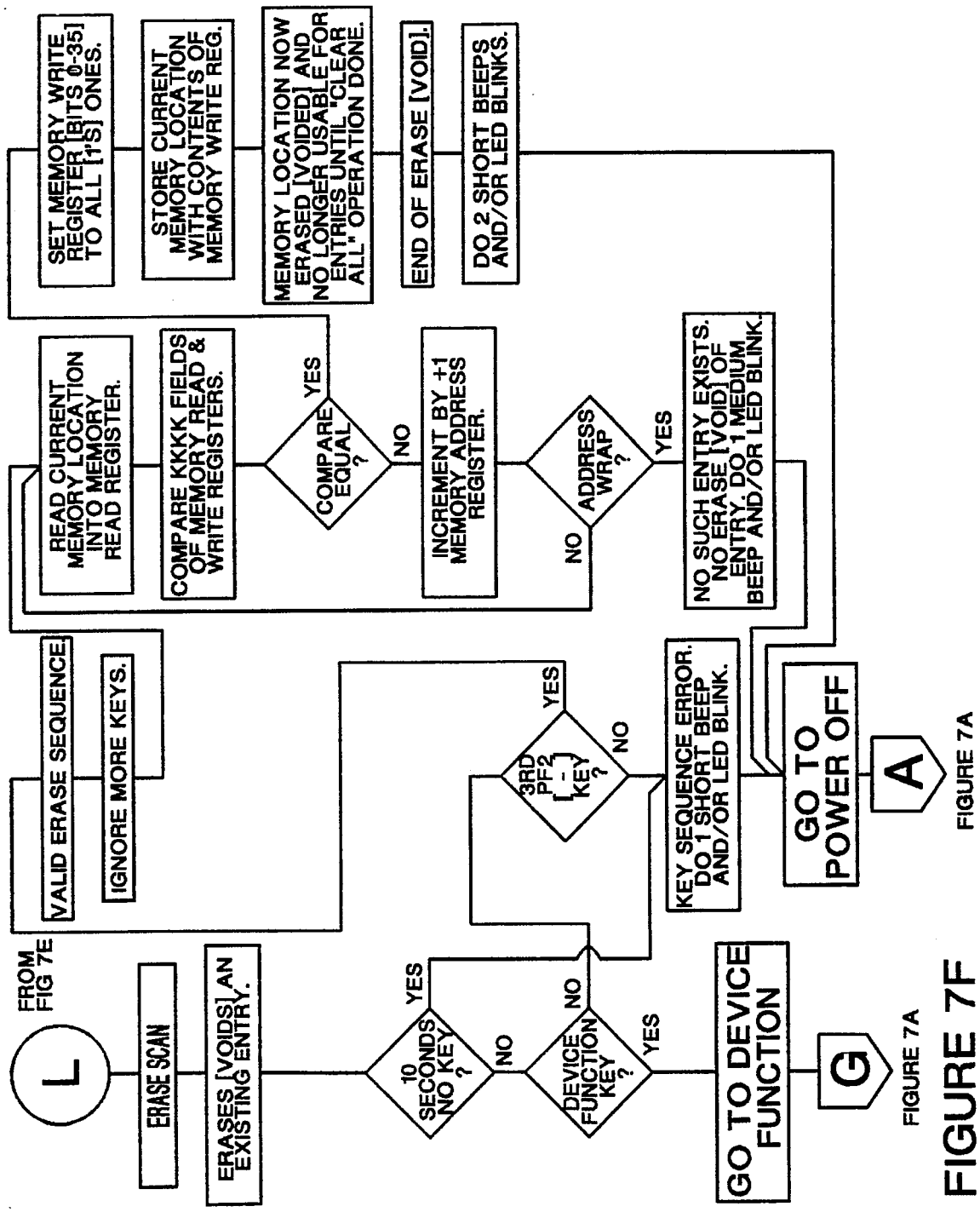

It is certified that error appears in the above-indentified patent and that said Letters Patent is hereby corrected as shown below:

| Column | Line | | |
|---|---|---|---|
| 3 | 29 | "Remotes" | --Remotes (Prior Art)-- |
| 3 | 31 | "Intergration" | --Integration-- |
| 3 | 39 | "FIG. 7" | --FIGS. 7A-7I-- |
| 3 | 57 | "is 256, 512, 1024, 2048, 4096, etc." | --is 128, 256, 512, 1024, 2048, 4096.-- |
| 9 | 11 | "=medium beep and red Led blink." | --=2 medium beeps and red Led blinks.-- |
| 9 | 61 | "indiated" | --indicated-- |
| 10 | 10 | "Remotes." | --Remotes (Prior Art).-- |
| 10 | 30 | "FIG. 7, Sheets 1-8." | --FIGS. 7A-7I.-- |
| 11 | 56 | FIG. 7, Sheets 1-8." | --FIGS. 7A-7I.-- |
| 12 | 9 | "FIG. 7, Sheets 1-8." | --FIGS. 7A-7I.-- |
| 12 | 62 | FIG. 7, Sheets 1-8." | --FIGS. 7A-7I.-- |
| 13 | 1 | "FIG. 7:" | --FIGS. 7A-7I:-- |
| 13 | 2 | "(8" | --(9-- |
| 13 | 3 | "This figure 7 (8 sheets) shows" | --These figures show-- |
| 13 | 20 | "START-SHEET 1" | --START-FIG. 7A-- |
| 13 | 31 | "POWER OFF- | |

UNITED STATES PATENT AND TRADEMARK OFFICE
CERTIFICATE OF CORRECTION

PATENT NO. : 5,523,800
DATED : June 4, 1996
INVENTOR(S) : Walter J. Dudek

It is certified that error appears in the above-indentified patent and that said Letters Patent is hereby corrected as shown below:

| | | | |
|---|---|---|---|
| 13 | 33 | SHEET 1,A" "TRANSLATE- | --POWER OFF-FIG. 7A, A-- |
| 13 | 41 | SHEET 1 & TRANSLATE MORE-SHEET 3,D" "READ SCAN- | --TRANSLATE-FIG. 7I, C-- |
| 13 | 44 | SHEET 3, C" "TRANSMIT- | --READ SCAN-FIG. 7C, D-- |
| 13 | 50 | SHEET 3, E" "PROGRAM- | --TRANSMIT-FIG. 7C, E-- |
| 13 | 56 | SHEET 2, B" "DEVICE FUNCTION- | --PROGRAM-FIG. 7B, B-- |
| 13 | 59 | SHEET 2, G" "WRITE- | --DEVICE FUNCTION-FIG. 7A, G-- |
| 13 | 64 | SHEET 4, H" "WRITE MORE- | --WRITE-FIG. 7D, H-- |
| 14 | 1 | SHEET 7, M" "WRITE SCAN- | --WRITE MORE-FIG. 7G, M-- |

UNITED STATES PATENT AND TRADEMARK OFFICE
CERTIFICATE OF CORRECTION

PATENT NO. : 5,523,800
DATED : June 4, 1996
INVENTOR(S) : Walter J. Dudek

It is certified that error appears in the above-indentified patent and that said Letters Patent is hereby corrected as shown below:

| | | | |
|---|---|---|---|
| 14 | 14 | SHEET 8, N"<br>"CLEAR ALL- | --WRITE SCAN-FIG. 7H, N-- |
| 14 | 17 | SHEET 5, K"<br>"CLEAR SCAN- | --CLEAR ALL-FIG. 7E, K-- |
| 14 | 22 | SHEET 3, F"<br>"ERASE- | --CLEAR SCAN-FIG. 7C, F-- |
| 14 | 27 | SHEET 5, J"<br>"ERASE SCAN-<br>SHEET 6, L" | --ERASE-FIG. 7E, J--<br>--ERASE SCAN-FIG. 7F, L-- |

Signed and Sealed this

Twenty-fourth Day of December, 1996

Attest:

BRUCE LEHMAN

*Attesting Officer*     *Commissioner of Patents and Trademarks*